United States Patent [19]

Yih et al.

[11] Patent Number: 5,729,498
[45] Date of Patent: Mar. 17, 1998

[54] REDUCED POWER CONSUMPTION SRAM

[75] Inventors: Jian-Yau Yih, Chung Li City; Yung-Yuan Ho, Chutung; Nang-Ping Tu, Hsinchu; Jung-Dar Ho, Chutung; Chien-Cheng Tu, Hsinchu; Shaw-Jia Hor, Chung Li City, all of Taiwan

[73] Assignee: Industrial Technology Research Institute, Hsinchu, Taiwan

[21] Appl. No.: 670,376

[22] Filed: Jun. 25, 1996

[51] Int. Cl.⁶ .............. G11C 7/00; G11C 7/02; G11C 8/00; G11C 11/00

[52] U.S. Cl. .............. 365/203; 365/207; 365/208; 365/230.03; 365/156

[58] Field of Search .................. 365/203, 207, 365/208, 230.03, 154, 156

[56] References Cited

U.S. PATENT DOCUMENTS

| | | | |
|---|---|---|---|
| 5,367,488 | 11/1994 | An | 365/203 |
| 5,383,158 | 1/1995 | Ikegami | 365/230.03 |
| 5,412,606 | 5/1995 | Lee | 365/203 |
| 5,432,747 | 7/1995 | Fuller et al. | 365/203 |
| 5,506,811 | 4/1996 | McLaury | 365/203 |
| 5,528,522 | 6/1996 | Kamisaki | 365/230.03 |
| 5,563,832 | 10/1996 | Kagami | 365/230.03 |

Primary Examiner—David C. Nelms
Assistant Examiner—Trong Phan
Attorney, Agent, or Firm—George O. Saile; Stephen B. Ackerman

[57] ABSTRACT

The continuing need for faster and denser SRAM memories places a constant increased demand on the power consumption of the memory devices. Much of the power consumption occurs during the pre-charge phase where it is common practice to bring up all pre-charge circuits at once and hold them active until the memory operations are complete. This invention describes a design where each pre-charge circuit connected to a group of memory cells through bit lines is activated at a separate time from the other pre-charge circuits. Thus each pre-charge circuit is active only during the time that useful work is being done with that portion of the memory. This reduces power consumption by not powering on circuits and precharging bit lines before they are actually needed.

14 Claims, 4 Drawing Sheets

REDUCED POWER CONSUMPTION SRAM

BACKGROUND OF THE INVENTION

1. Field of Invention

This invention relates to static random access memories and in particular individually controlling precharge circuits to be on one at a time to reduce power consumption.

2. Description of Related Art

The need to reduce power consumption continues to be an important design goal as the demand for faster and more dense semiconductor devices continues. The static random access memory, or SRAM, being a device wherein having a design that conserves power is important to being able to produce denser and faster high speed memories.

The area related to this invention is the control of the precharge circuitry in an SRAM which is used to condition the bit lines connecting memory cells to data out and data in circuitry. When the memory cells are selected the capacitance of the bit lines are charged to a bias voltage through the precharge transistors. In the initial rendition of the precharge circuitry the gates of the transistors were connected together with the drains and tied to a bias voltage forming a bias resistor that was constantly available to supply power to the all bit lines and associated circuitry. Referring to U.S. Pat. No. 5,412,606 (Lee), the gates of the precharge circuit transistors are all connected together and controlled to be on by a control signal as a step to conserving power. This reduced the amount of time the precharge circuits were available to supply power. Referring to U.S. Pat. No. 5,432,747 (Fuller et al.), another approach to controlling the precharge signal is a clocked and self timed precharge cycle initiated by recognizing the end of a memory access cycle and initiating a precharge cycle. In this invention the precharge period is minimized.

The problem with these approaches is that all bit lines are pre-charged at one time consuming unnecessary power, and further all cells connected to an activated word line draw power. This is somewhat wasteful if only one memory cell is being accessed. Substantial power consumption can be saved by precharging and controlling only the bit lines associated with the cell being accessed. In this way those circuit not being used during a particular memory access are not powered, resulting in a considerable amount of power consumption.

SUMMARY OF THE INVENTION

There are few choices that can be made to reduce SRAM power in an environment where faster and denser memories are in demand. Reducing the amount of time circuits are activated to be on is one way to reduce power consumption. Further if there are circuits that are not used during a particular memory access, being able to control them to be off will produce a savings in power consumption.

In this invention the memory cells of an SRAM is divided into different groups. Each group of memory cells is connected to a different set of bit lines. A different precharge circuit is connected to each set of bit lines for the purpose of preconditioning and providing a bias. Also connected to each set of bit lines is a bit access circuit that connects data between the bit lines and memory data in and out circuitry. Each of the precharge circuits are controlled to be active at a different time. The control signals for adjacent precharge circuits can range from being time separated in different clock cycles to partially overlapped where the leading edge of one control signal occurs at the same time as the lagging edge of a time adjacent control signal. This overlap provides performance at an improved power whereas separating the precharge control signals into different clock cycles provides additional power saving at a reduced performance. Thus this invention can provide a range performance and power consumption combinations for use in different product requirements.

Each bit access circuit connects data to a sense amplifier when a write enable circuit is inactive. When the write enable circuit is active the signals of the data input circuit are transferred to the memory cells. This is accomplished by pulling to ground a previously high bit line, and letting the other bit line of the differential pair rise to the bias voltage connected to the precharge circuit. If the new data signals are the same as the previous signals on the bit lines, no changes are made in the bit line voltages.

The precharge circuit of this invention provides three functions. First as a precharge circuit for preconditioning the bit lines connected to a group of bit lines so that data will transfer to and from the memory cells more quickly. Second to provide a bias during read operations, and third to control when the precharge and bias capabilities are available to the group bit lines and memory cells connected to the precharge circuit.

BRIEF DESCRIPTION OF THE DRAWINGS

This invention will be described with reference to the accompanying drawings, wherein.

DETAILED DESCRIPTION OF THE PREFERRED EMBODIMENT

Figure 1:
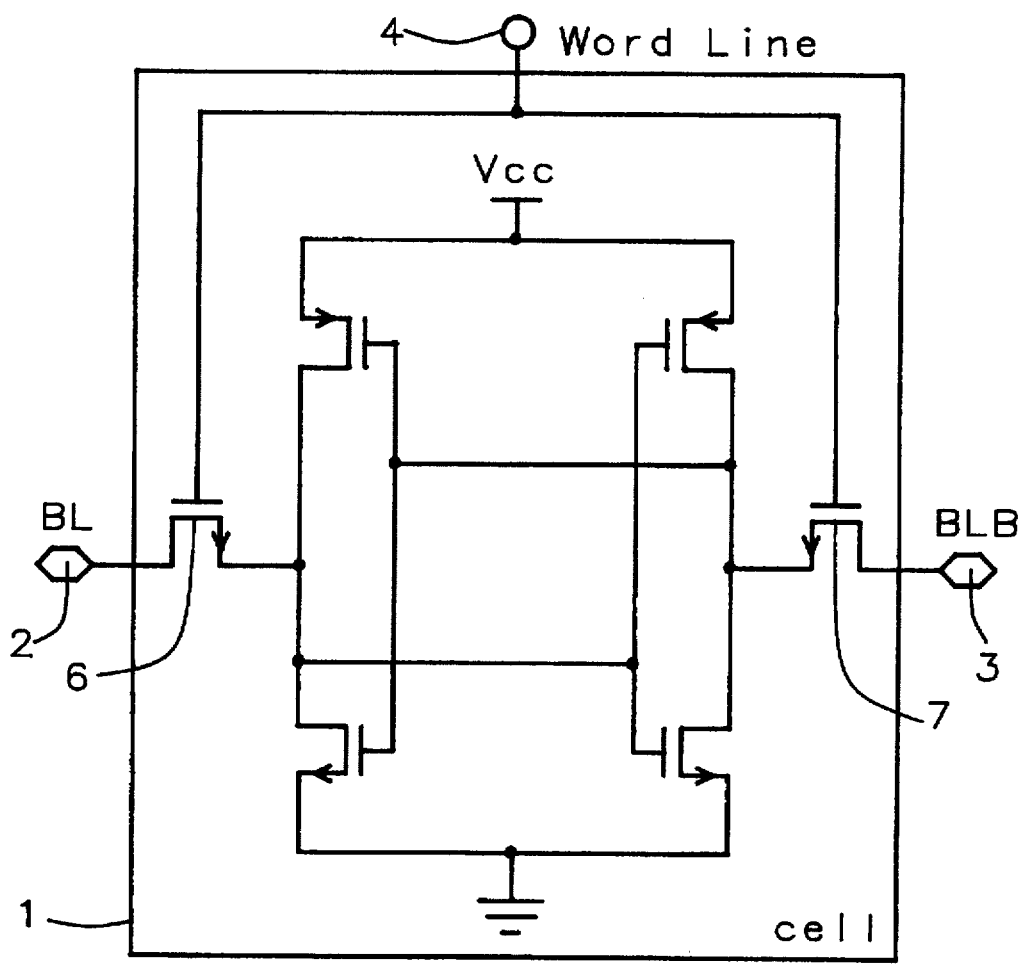
FIG. 1 is a schematic of a six transistor SRAM memory cell used to provide a complete picture of the invention.
Figure 2:
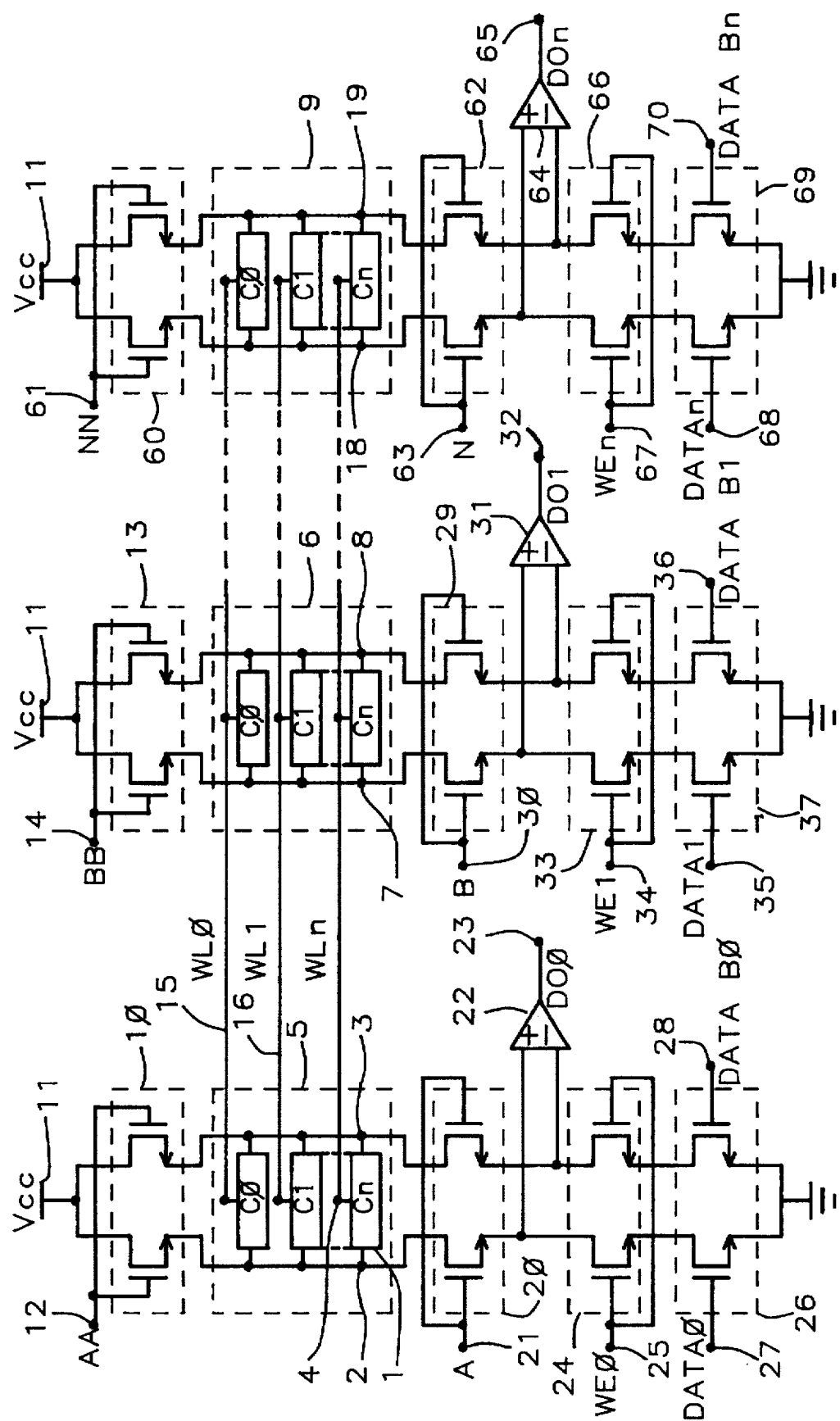
FIG. 2 is the schematic diagram of the separate bit lines and the associated control and biasing circuitry according to the invention.

Shown in FIG. 1 is a six transistor static random access memory cell 1 included for reference and completeness of the description of this invention. There are three signal lines connecting to the memory cell, a bit line (BL) 2, a bit line bar (BLB) 3 and a word line 4. Two input and output transistors 6 and 7 are controlled by the word line 4 and are connected to the bit lines 2 and 3. Referring to FIG. 2, there are several groupings 5, 6 and 9 of memory cells 1. Within each grouping represented by 5, 6 and 9 there are several memory cells 1 denoted by C0, C1 and Cn. Each grouping 5 of memory cells 1 is connected to a bit line (BL) 2 and bit line bar (BLB) 3 (further referred to as bit lines 2 and 3) which are separate and distinct from the other groupings 6 and 9 of memory cells having bit line (BL) 7 and 18 and bit line bar (BLB) 8 and 19. Between groupings of memory cells are connected several word lines 4, 15 and 16 denoted by WL 0, WL 1 and WL n. Each word line 4 connects to one memory cell 1 in each of the groupings 5, 6 and of memory cells.

Continuing to refer to FIG. 2, the bit lines 2 and 3, 7 and 8, and 18 and 19 of each grouping 5, 6 and 9 are connected to a separate precharge circuit 10, 13 and 60 which in turn is connected to a voltage source Vcc 11. Each precharge circuit is controlled by a separate control signal 12, 14 and 61 denoted by control signals AA, BB and NN. The precharge circuit 10 is used to precondition the bit lines 2 and 3 prior to reading or writing the memory cells 1, and to provide a bias to the circuitry connected to the bit lines 2 and 3. Similarly precharge circuits 13 and 60 precondition and bias bit lines 7 and 8, and 18 and 19. Further connected to each set of bit lines 2 and 3 are bit access circuits 20, 29 and 62 each having a separate control signal input 21, 30 and 63 denoted by signals A, B and N. Connected to each bit access circuit 20, 29 and 62 is a sense amplifier 22, 31 and 64 to provide data output 23, 32 and 65 with data output signals DO0, DO1 and DOn of the signals stored in the memory cells 1. Further connected to each bit access circuit 20, 29 and 62 is a write enable circuit 24, 33 and 66 circuit 24 which has as its input a write enable signal 25, 34 and 67 denoting write enable signals by WE0, WE1 and WEn and each signal input of which is separate from other write enable circuits. The write enable circuits 24, 33 and 66 when activated by the write enable signals 25, 34 and 67 connects the data 27 (DATA0) and 28 (DATA B0), 35 (DATA1) and 36 (DATA B1), and 68 (DATAn) and 70 (DATA Bn) held in the data input circuit 26, 37 and 69 through to the bit access circuit. If the bit access circuit 20 is controlled on by control input 21 and the precharge circuit 10 is controlled on by the precharge signal input 12, then the data 27 and 28 will be written into the memory cell 1 that is activated by a signal on word line 4. The bit lines for each grouping of memory cells 5, 6 and 9 are connected to a different bit access circuit 20, 29 and 62 through which is connected different sense amplifiers 22, 31 and 64 and write enable circuits 24, 33 and 66.

Figure 3A:
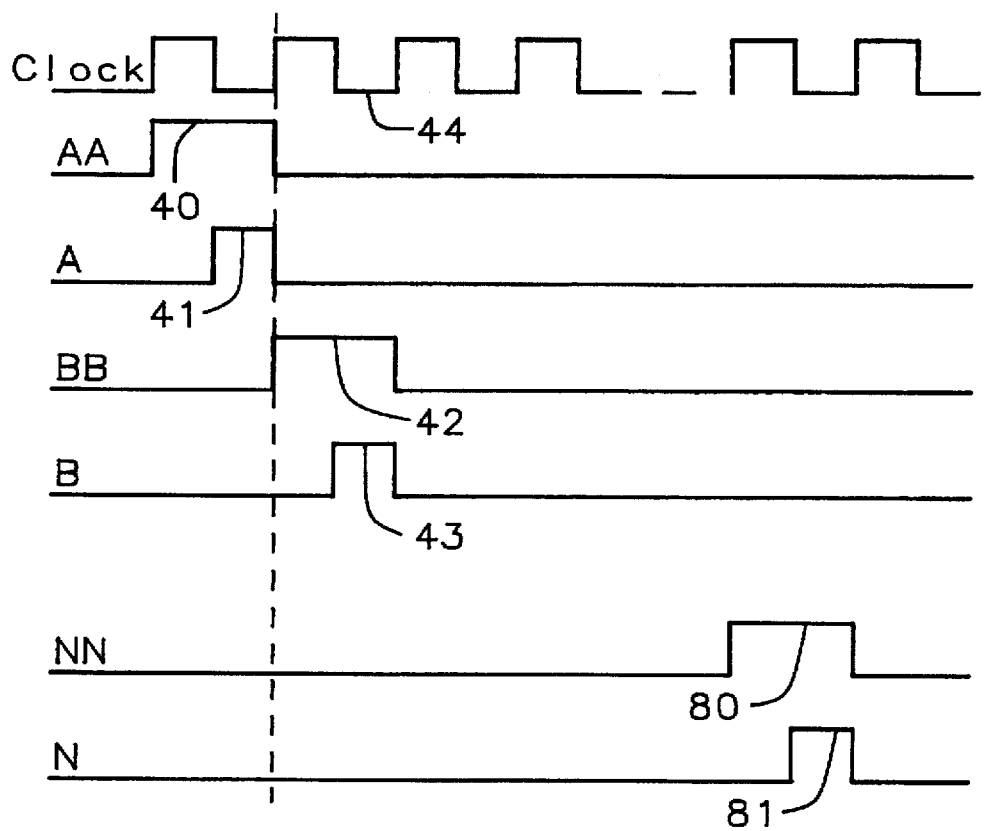
FIGS. 3a–3c shows the sequenced timing of the control signals for the separately controlled precharge and bit access circuitry according to the invention.

Referring to FIG. 3a, shown are the precharge control signal (AA) 40 for the precharge circuit input 12, 14 and 61 and the control signal (A) 41, (B) 43 and N (81) for the bit access circuit input 21, 30 and 63. The precharge control signal (AA) 40 leads in its timing the bit access control signal (A) 41 to allow each of the bit lines 2 and 3 to be charged toward the Vcc bias 11. If a word line 4 is on, the bit lines will charge to the values stored in each side of the particular memory cell 1 which is activated by a signal on word line 4. When the bit access control signal (A) 41 occurs at the input 21 of the bit access circuit 20, the signals on the bit lines 2 and 3 are connect to the sense amplifier 22 and the signal stored in the memory cell 1 is converted by the sense amplifier 22 to the data output signal 23. If the precharge control signal (A) 41 has been turned off and the write enable circuit 24 has been controlled on by a write enable signal 25, the data input signals 27 and 28 of the data input circuit 26 will be connected through to the bit lines 2 and 3 and coupled into the memory cell through transistors 6 and 7 shown in FIG. 1 when a signal on a word line 4 is applied.

Figure 3B:
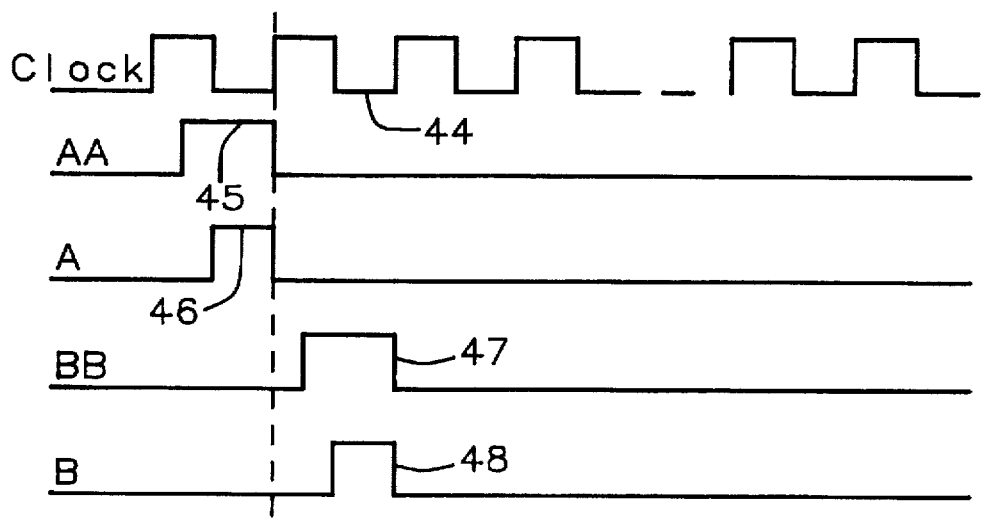

Continuing to refer to FIG. 3a, there are several precharge control signals represented by (AA) 40 and (BB) 42. Precharge control signal (AA) 40 is connected to the control input 12 of precharge circuit 10 and control signal (BB) 42 is connected to the control input 14 of precharge circuit 13. Timed within each precharge control signal (AA) 40 and (BB) 42 are bit access control signals represented by (A) 41 and (B) 43. Bit access control signal (A) 41 connected to control signal input 21 of bit access circuit 20 and control signal (B) 43 is connected to control signal input 30 of bit access circuit 29. The timing of each precharge control signal occurs in a different cycle of the read clock 44 providing savings in power consumption by powering on only circuits that are in use at a particular time. The bit access control signals represented by (A) 41 and (B) 43 occur in the later part of the precharge circuit control signal timing (AA) 40 and (BB) 42. This allows the precharging of the bit lines 2 and 3 of memory cell grouping 5 with control signal (AA) 40 and bit lines 7 and 8 of memory cell grouping 6 by control signal (BB) 42. The precharge of the bit lines 2 and 3, and 7 and 8 precede the reading of data from the grouping of memory cells 5 and 6, respectively. Each reading of data from each grouping of memory cells 5 and 6 occurs during a different cycle of the read clock 44. Referring to FIG. 3b, if the combined time required to precharge the bit lines 2 and 3, and 7 and 8; and the time for bit access control signal (AA) 46 and (B) 48 are less than a cycle of the read clock 44, then the precharge control signal (AA) 45 and (BB) 47 connected to control inputs 12 and 14, respectively, can be made smaller than the cycle of the read clock 44. This in turn provides additional savings in memory power consumption.

Figure 3C:
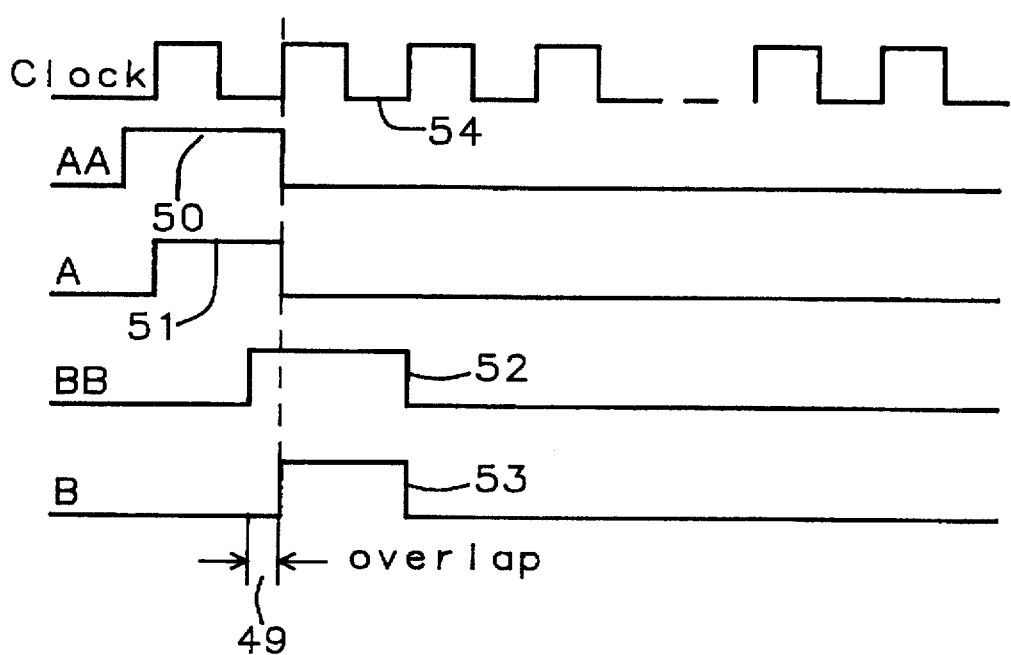

Referring to FIG. 3c, a timing overlap 49 is shown between time adjacent precharge circuit control signals (AA) 50 and (BB) 52. Within the timing of each precharge control signal (AA) 50 and (BB) 52 connected to precharge control input 12 and 14 is the timing of the bit access control signal (A) 51 and (B) 53 connected to the bit access control input 21 and 30, respectively. The precharge control signal (AA) 50 and (BB) 52 and the bit line access control signal (A) 51 and (B) 53 are turned off at the end of the respective cycles of read clock 54 within which they are timed. In this timing configuration the bit access control signals (A) 51 and (B) 53 take up most of a cycle of the read clock 54 leaving inadequate time for precharging bit lines 2 and 3, and 7 and 8. In order to provide sufficient time to precharge bit lines 2 and 3, and 7 and 8 the time adjacent precharge circuit control signals represented by (AA) 50 and (BB) 52 are overlapped 49 in time. The leading portion of the precharge control signal (BB) 52 is overlapped in time with the lagging portion of the previous time activated precharge control signal (AA) 50. This allows precharge circuits represented by 10 and 13 of FIG. 2 to be controlled to be on during separate cycles of the read clock 54 and overlapped 49 during a portion of a cycle to accommodate precharging bit lines 7 and 8 by precharge control signals (BB) 52. Bit lines 2 and 3 are precharged by the overlap control signal (AA) 50 with the previously timed precharge signal. The timing configuration of FIG. 3c providing power consumption savings while accommodating the timing requirements of the memory circuits.

While the invention has been particularly shown and described with reference to preferred embodiments thereof, it will be understood by those skilled in the art that various changes in form and details may be made without departing from the spirit and scope of the invention.

What is claimed is:

1. A static random access memory, SRAM, and comprising:

a) memory cells, precharge circuits, bit access circuits, sense amplifiers, write enable circuits and data in circuits, b) said memory cells divided into groups of memory cells and within each group said memory cells connected in parallel by means of bit lines, c) memory cells connected between each group of said groups of memory cells by word lines with only one memory cell within each group of said groups of memory cells connected to a same word line, d) said bit lines within each group of said groups of memory cells connected to Vcc through a precharge circuit, e) said precharge circuit within each group of said groups of memory cells controlled by a separate control signal, f) said precharge circuit connected to each different group of said groups of memory cells and timed such that each said precharge circuit is controlled to be active at a different time, g) the bit lines in each group of said groups of memory cells connected to a bit access circuit through which is connected a sense amplifier and a write enable circuit for each group of said groups of memory cells, h) said write enable circuit further connected to a data input circuit, i) said bit access circuit controlled by a bit access control signal, j) the bit access control signal timed to fall within a timing of a precharge circuit control signal, k) said write enable circuit, when active, connecting input data to the bit access circuit and through to a memory cell activated by a word line signal when the bit access circuit is active.

2. The SRAM of claim 1 wherein the timing of the precharge circuit control signal occurs within different read clock cycles to reduce power consumption.

3. The SRAM of claim 2 wherein the timing of said precharge circuit control signal is less than a read clock cycle further reducing power consumption, and comprising:

a) said precharge circuit control signal timed to allow bit line precharging and bit access for a memory read access, b) a bit access control signal time less than said read clock cycle, c) a bit line precharging time less than the read clock cycle, d) sum of said bit access control signal time and said bit line precharging time being less than the read clock cycle.

4. The SRAM of claim 2 wherein time adjacent precharge circuit control signals are partially overlapped in time, and comprising:

a) each said precharge circuit control signal timed to allow bit line precharging and bit access for a memory read access, b) a bit access control signal time less than a read clock cycle, c) a bit line precharging time less than the read clock cycle, d) sum of said bit access control signal time and said bit line precharging time being greater than the read clock cycle, e) said bit line precharging being done at a beginning of the precharge signal and overlapped with the previous timed precharge control signal, f) said overlap providing additional time to complete a precharge function and conserve power consumption by precharge signals being mostly in separate read cycles.

5. The SRAM of claim 1 wherein a differential pair of lines are used to connect together circuit elements in the data paths, and consisting:

a) differential connection of bit lines to memory cells, precharge circuits and bit access circuits, b) differential connection of sense amplifiers and write enable circuits to bit access circuits, c) differential connection of and data in circuits to write enable circuits.

6. The SRAM of claim 1 wherein the precharge circuit conditions and provides bias to the bit lines within a timed control signal, and comprising:

a) a precharge circuit connected to each group of memory cells by means of bit lines and being individual controlled, b) a bit access circuit connected to each group of memory cells by means of bit lines and being individual controlled, c) said precharge circuit, when activated by a control signal, connecting the bit lines to Vcc through precharge circuit control transistors, d) a bit line voltage being dependent upon a signal stored in an active memory cell when the precharge circuit is on and the bit access circuit is off, e) said active memory cell being activated by a word line signal, f) said bit line voltage dependent upon the signal stored in an active memory cell when the precharge circuit and the bit access circuit are on and the write enable circuit is off, g) said bit line voltage dependent upon a data input signal when the bit access circuit and the write enable circuit are on and the precharge circuit is off.

7. A static random access memory, SRAM, with individually controlled precharge circuits to reduce power dissipation, and comprising:

a) memory cells grouped together into several groups, b) bit lines within each group of said groups connecting said memory cells together in parallel, c) the bit lines within each group of said groups further connected to a precharge circuit and a bit access circuit, d) the precharge circuit connecting a voltage bias to the bit lines through transistors in the precharge circuit, e) the bit access circuit connecting the bit lines to a sense amplifier and through a write enable circuit to a data in circuit, f) several word lines connecting memory cells together in different said groups with one memory cell in each group of said groups connected to each word line, g) a word line signal selecting a memory cell in each group of said groups and when the precharge circuit is activated a signal stored in the memory cell is transferred to the bit lines, h) the bit access circuit made active within a timing of the precharge circuit signal and connecting the bit line signals to the sense amplifier for data output, i) each precharge circuit connected to each group of memory cells activated at a different time to reduce power dissipation.

8. The SRAM of claim 7 wherein a write enable signal allows input data to be connected to the bit lines and written into the memory cells when the precharge circuit is off and the bit access circuit is active for each group of said groups of the memory cells.

9. The SRAM of claim 7 wherein time adjacent precharge circuit control signals are overlapped to allow bit line precharge and memory bit access, and comprising:

a) a precharge circuit control signal having a duration to allow bit line precharging and bit access for memory read operation, b) a bit access control signal timing beginning at a start of a read clock cycle and ending at an end of the read clock cycle, c) said precharge circuit control signal turned off at the end of a read clock cycle, d) said precharge circuit control signal overlapped with a previous timed precharge circuit control signal, e) bit line precharging occurring at a beginning of the precharge circuit control signal and overlapped with the bit line access of a time previous memory group.

10. The precharge circuit control signals of claim 9 wherein the bit access control signal timing is less than the read clock cycle, and a sum of the bit line precharge and bit access is larger than a cycle requiring overlap of adjacent precharge signals.

11. A SRAM with multiple precharge circuits controlled to be active at different times to reduce power consumption, and comprising:
   a) a number of memory cells connected together by bit lines into a group of memory cells,
   b) said group of memory cells connected to a precharge circuit and a bit access circuit by means of the bit lines,
   c) the precharge circuit connecting bias voltage to the bit lines,
   d) the bit access circuit connecting read and write circuitry to the bit lines to permit data to be read out and written into the group of memory cells,
   e) a precharge circuit control signal timed to be within a clock cycle,
   f) a bit access circuit control signal being timed to occur within the timing of the precharge circuit control signal,
   g) said bit access circuit control signal lagging the leading edge of the precharge circuit control signal and ending at the end of said clock cycle when the precharge circuit control signal ends,
   h) said bit lines being precharged during the beginning of the timing of said precharge circuit control signal,
   i) a plurality of groups of memory cells, each containing different memory cells connected by different bit lines to different precharge circuit and different bit access circuit,
   j) each memory group being activated in a different clock cycle by a precharge circuit,
   k) precharge circuit control signal being timed such as to allow some overlap in timing between precharge circuit control signals in adjacent clock cycles,
   l) timing of each precharge circuit control signal in a different read clock cycle providing savings in power consumption by powering on only circuits in use.

12. The timing of the precharge control signals of claim 11 wherein said precharge control signals are not overlapped.

13. The SRAM of claim 11 wherein data is read from memory cells, and comprising:
   a) each memory cell selected by a word line and transfers a stored signal to bit lines during a time when a precharge circuit connected to the bit lines is activated,
   b) said stored signal is connected to sense amplifiers to be read out when the bit access circuit is active during the time said precharge circuit is active.

14. The SRAM of claim 11 wherein data is written into the memory cells under the timed control of a write enable circuit and the bit access circuit, and comprising:
   a) data input signals connected to said data input circuits,
   b) a precharge control signal connected to the memory cells controlled off,
   c) bit access circuit connected to said group of memory cells being activated,
   d) a write enable circuit connected to said bit access circuit activated with a write enable signal,
   e) said write enable circuit connecting input data circuits to said bit access circuits,
   f) removal of the write enable signal and bit access control signal locking data input signal into the memory cell.

* * * * *